US010797199B2

(12) United States Patent
Yoon et al.

(10) Patent No.: US 10,797,199 B2
(45) Date of Patent: Oct. 6, 2020

(54) APPARATUS AND METHOD FOR MANUFACTURING LED MODULE

(71) Applicant: SAMSUNG ELECTRONICS CO., LTD., Suwon-si (KR)

(72) Inventors: Jung-Hoon Yoon, Yongin-si (KR); Kyung Hoon Cha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/038,932

(22) Filed: Jul. 18, 2018

(65) Prior Publication Data
US 2019/0027639 A1    Jan. 24, 2019

(30) Foreign Application Priority Data
Jul. 18, 2017  (KR) .................. 10-2017-0090702

(51) Int. Cl.
| H01L 33/00 | (2010.01) |
| H01L 21/683 | (2006.01) |
| H01L 23/00 | (2006.01) |
| H01L 25/075 | (2006.01) |
| H01L 33/62 | (2010.01) |

(52) U.S. Cl.
CPC ........ *H01L 33/005* (2013.01); *H01L 21/6835* (2013.01); *H01L 24/81* (2013.01); *H01L 25/0753* (2013.01); *H01L 33/62* (2013.01); *H01L 2221/68354* (2013.01); *H01L 2221/68368* (2013.01); *H01L 2933/0033* (2013.01); *H01L 2933/0066* (2013.01)

(58) Field of Classification Search
CPC ............................ H01L 21/683–68792; H01L 2221/68304–68395; H01L 33/00–648
See application file for complete search history.

(56) References Cited

U.S. PATENT DOCUMENTS

| 7,943,052 B2 * | 5/2011 | Wu ...................... B23K 3/0623 216/20 |
| 9,318,475 B2 * | 4/2016 | Bibl ........................ G09F 9/301 |

(Continued)

FOREIGN PATENT DOCUMENTS

| KR | 10-2016-0087264 A | 7/2016 |
| KR | 10-1672781 B1 | 11/2016 |
| KR | 10-1754528 B1 | 7/2017 |

OTHER PUBLICATIONS

International Search Report dated Oct. 17, 2018 issued by the International Searching Authority in counterpart International Application No. PCT/KR2018/008052 (PCT/ISA/210).

*Primary Examiner* — Eric A. Ward
(74) *Attorney, Agent, or Firm* — Sughrue Mion, PLLC

(57) ABSTRACT

An apparatus and method capable of efficiently manufacturing a LED module. The method of manufacturing an Light Emitting Diode (LED) module includes preparing a substrate and a carrier on which an LED chip is disposed, disposing a mask on the substrate, the mask including an opening and a wall defining or forming the opening, picking up the LED chip from the carrier with a stamp, moving the LED chip picked up by the stamp to face the opening, moving the LED chip so that at least a part of the LED chip is inserted into the opening, and positioning the LED chip on the substrate by moving the LED chip so that the at least a part of the LED chip contacts the wall.

10 Claims, 14 Drawing Sheets

(56) References Cited

U.S. PATENT DOCUMENTS

| | | | |
|---|---|---|---|
| 9,825,014 B2* | 11/2017 | Cha | H01L 25/0753 |
| 10,396,237 B2* | 8/2019 | Wang | H01L 33/00 |
| 2002/0043923 A1* | 4/2002 | Natori | G09F 9/33 |
| | | | 313/495 |
| 2012/0262054 A1* | 10/2012 | Ooyabu | H01L 33/56 |
| | | | 313/498 |
| 2012/0320581 A1 | 12/2012 | Rogers et al. | |
| 2013/0285086 A1 | 10/2013 | Hu et al. | |
| 2015/0132873 A1 | 5/2015 | Rogers et al. | |
| 2017/0140961 A1* | 5/2017 | Sasaki | H01L 25/0753 |
| 2017/0215280 A1* | 7/2017 | Chaji | H05K 1/111 |

* cited by examiner

APPARATUS AND METHOD FOR MANUFACTURING LED MODULE

CROSS-REFERENCE TO RELATED APPLICATION

This application is based on and claims priority under 35 U.S.C. § 119 to Korean Patent Application No. 10-2017-0090702, filed on Jul. 18, 2017, in the Korean Intellectual Property Office, the disclosure of which is incorporated by reference herein in its entirety.

BACKGROUND

1. Field

The disclosure relates to an apparatus and a method for manufacturing a Light Emitting Diode (LED) module, and more particularly, to an apparatus and method capable of efficiently manufacturing a LED module.

2. Description of Related Art

A display device is a type of an output device for visually displaying data information such as characters and figures, images, or the like.

The display device includes a self-emitting display panel such as an Organic Light-Emitting Diode (OLED) or a light-receiving display panel such as a Liquid Crystal Display (LCD).

Further, a new display panel can be realized by modularly combining a plurality of LEDs with each other. In this case, the plurality of LEDs has a size of micro-unit to display a high resolution image.

In order to manufacture a micro LED as a display panel, a plurality of micro LEDs manufactured on a wafer must be moved to a single substrate, and high resolution image display and color reproducibility of the display panel are greatly influenced by a technology of moving and arranging the plurality of micro LEDs.

SUMMARY

Therefore, it is an aspect of the disclosure to provide an apparatus and a method for manufacturing a Light Emitting Diode (LED) module having an improved structure capable of realizing a display device having a high resolution.

It is another aspect of the disclosure to provide an apparatus and a method for manufacturing an LED module having an improved structure to prevent an LED chip from being damaged during a process of transferring the LED chip and positioning the LED chip on a substrate.

It is still another aspect of the disclosure to provide an apparatus and a method for manufacturing an LED module having an improved structure to easily position an LED chip on a substrate.

Additional aspects of the disclosure will be set forth in part in the description which follows and, in part, will be obvious from the description, or may be learned by practice of the disclosure.

In accordance with an aspect of the disclosure, a method of manufacturing an Light Emitting Diode (LED) module may include preparing a substrate and a carrier on which an LED chip is disposed, disposing or placing a mask on the substrate, the mask including an opening and a wall defining the opening or a wall which forms the opening, picking up or taking the LED chip from the carrier with a stamp, moving the LED chip picked up by the stamp to face the opening, moving the LED chip so that at least a part of the LED chip is inserted into the opening, and positioning the LED chip on the substrate by moving the LED chip so that the at least a part of the LED chip contacts the wall.

In accordance with an aspect of the disclosure, the method of manufacturing the Light Emitting Diode (LED) module may further include separating the mask from the substrate.

In accordance with an aspect of the disclosure, the method of manufacturing the Light Emitting Diode (LED) module may further include moving the LED chip in a first direction so that the at least a part of the LED chip is inserted into the opening, and moving the LED chip in a second direction so that the at least a part of the LED chip contacts the wall.

The opening and the wall may be alternately disposed in the second direction.

The opening may include a shorter side extending in the second direction, and a longer side extending in a third direction.

The opening may include a plurality of openings arranged in a grid pattern.

The opening may include a curved portion.

In accordance with an aspect of the disclosure, the method of manufacturing the Light Emitting Diode (LED) module may further include using a magnetic force to position the LED chip on the substrate.

The LED chip may include a material responding to the magnetic force.

In accordance with an aspect of the disclosure, the method of manufacturing the Light Emitting Diode (LED) module may further include moving the LED chip picked up by the stamp toward the substrate in a state in which the LED chip is attached on the stamp, and linearly moving or turning the stamp after at least a part of the LED chip is inserted into the opening.

A width of the opening may be 120% of a width of the LED chip measured in the second direction.

In accordance with another aspect of the disclosure, an apparatus of manufacturing an Light Emitting Diode (LED) module may include a carrier on which an LED chip is disposed, a substrate disposed adjacent to the carrier, a stamp configured to move to pick up the LED chip from the carrier and to place the LED chip on the substrate, and a mask positioned on the substrate, and including an opening.

The mask may be detachably disposed on the substrate.

The mask may further include a wall defining the opening. The stamp may linearly move or turn to make the LED chip contact the wall to separate the LED chip from the stamp.

When the stamp linearly moves, a width of the opening may be 120% of a width of the LED chip measured in a direction in which the stamp moves.

In accordance with another aspect of the disclosure, an apparatus of manufacturing an Light Emitting Diode (LED) module may further include an electromagnet disposed adjacent to the substrate so that the LED chip is separated from the stamp and positioned on the substrate.

The electromagnet may be detachably disposed to face the stamp with the substrate in between.

The mask may be integrated into the substrate so that the LED chip is positioned on the substrate through the opening.

BRIEF DESCRIPTION OF THE DRAWINGS

These and/or other aspects of the disclosure will become apparent and more readily appreciated from the following description of certain embodiments, taken in conjunction with the accompanying drawings, in which.

DETAILED DESCRIPTION OF EXEMPLARY EMBODIMENTS

Hereinafter, exemplary embodiments will be described in detail with reference to the appended drawings. In the following description, the terms "front end", "rear end", "upper portion", "lower portion", "upper end", and "lower end" are defined based on the drawings, and the shapes and positions of the corresponding components are not limited by the terms.

Hereinafter, "w1" refers to a width of an Light Emitting Diode (LED) chip, and "w2" refers to a width of an opening.

Figure 1:
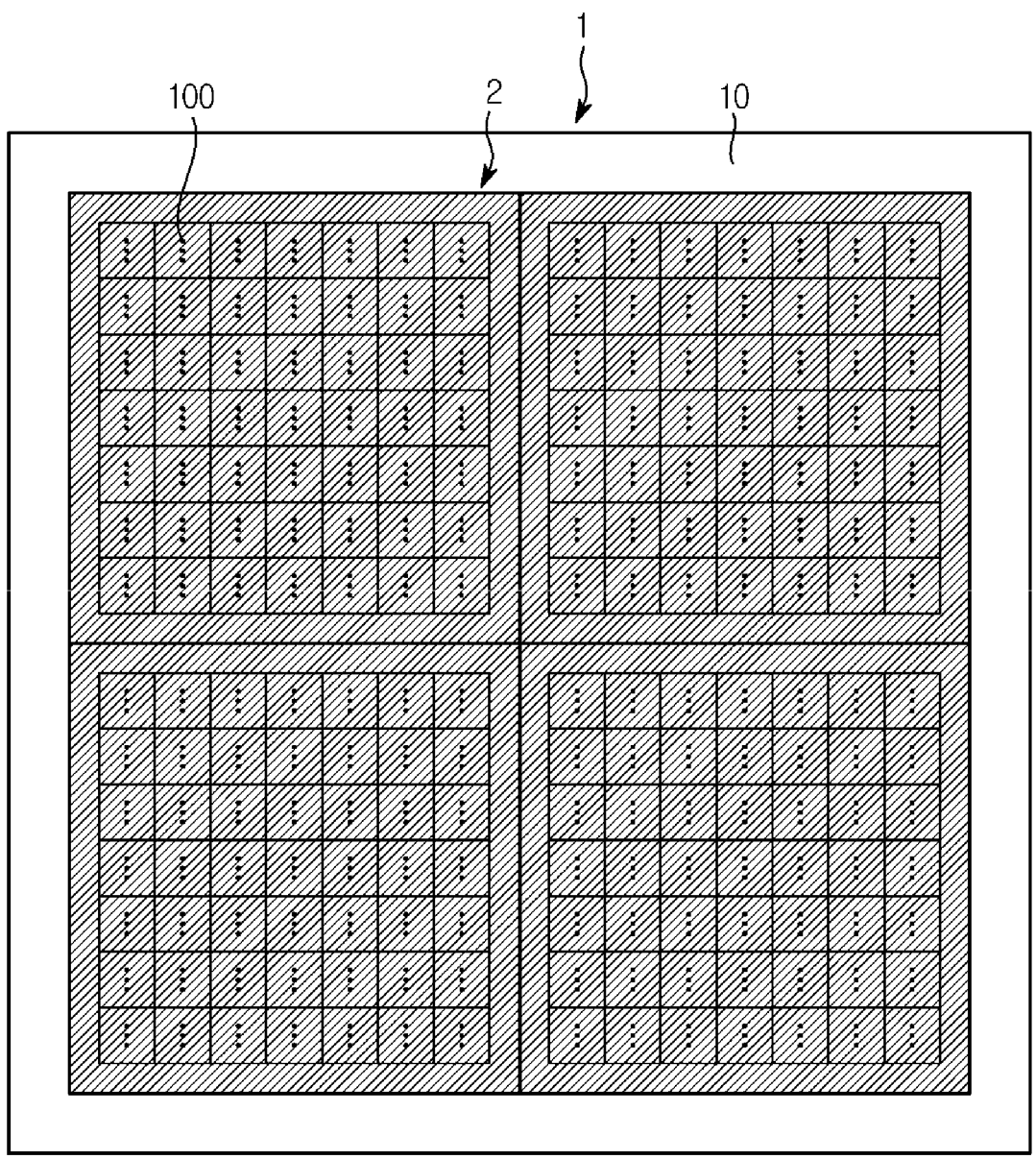
FIG. 1 is a view illustrating an Light Emitting Diode (LED) module manufactured by an LED module manufacturing method according to an embodiment.

FIG. 1 is a view illustrating an LED module manufactured by an LED module manufacturing method according to an embodiment. For reference, FIG. 1 shows a molded LED module. In FIG. 1, a molded portion is shaded.

As shown in FIG. 1, an LED module 1 may include a substrate 10, and an LED chip 100 disposed on the substrate 10. More specifically, the LED module 1 may include the substrate 10, and a plurality of LED chips 100 disposed on the substrate 10. The plurality of LED chips 100 may be disposed on the substrate 10 to form a specific pattern.

The substrate 10 may be a Printed Circuit Board (PCB).

The LED chips 100 may include a red LED chip, a green LED chip, and a blue LED chip. The LED chips 100 may be arranged on the substrate 10 such that the red LED chip, the green LED chip, and the blue LED chip form one unit.

The LED chip 100 may include a pad 101 (see FIG. 3), and an electrode 102 (see FIG. 3) disposed on one surface of the pad 101. The electrode 102 may include a positive (+) electrode and a negative (−) electrode. Preferably, the pad 101 may be formed of a metal material. The electrode 102 of the LED chip 100 may be electrically connected to an electrode 11 (see FIG. 3) provided on the substrate 10 by a solder 12 (see FIG. 3).

As shown in FIG. 1, if the LED chips 100 are densely disposed on the substrate 10, a display device having a high resolution can be realized. A process of accurately and densely disposing the LED chips 100 on the substrate 10 requires high precision. Hereinafter, a method of accurately and densely disposing the LED chips 100 on the substrate 10 will be described in detail.

The LED module 1 shown in FIG. 1 may be manufactured by at least one of an LED module manufacturing method according to a first embodiment, an LED module manufacturing method according to a second embodiment, an LED module manufacturing method according to a third embodiment, an LED module manufacturing method according to a fourth embodiment, and an LED module manufacturing method according to a fifth embodiment.

Figure 2:
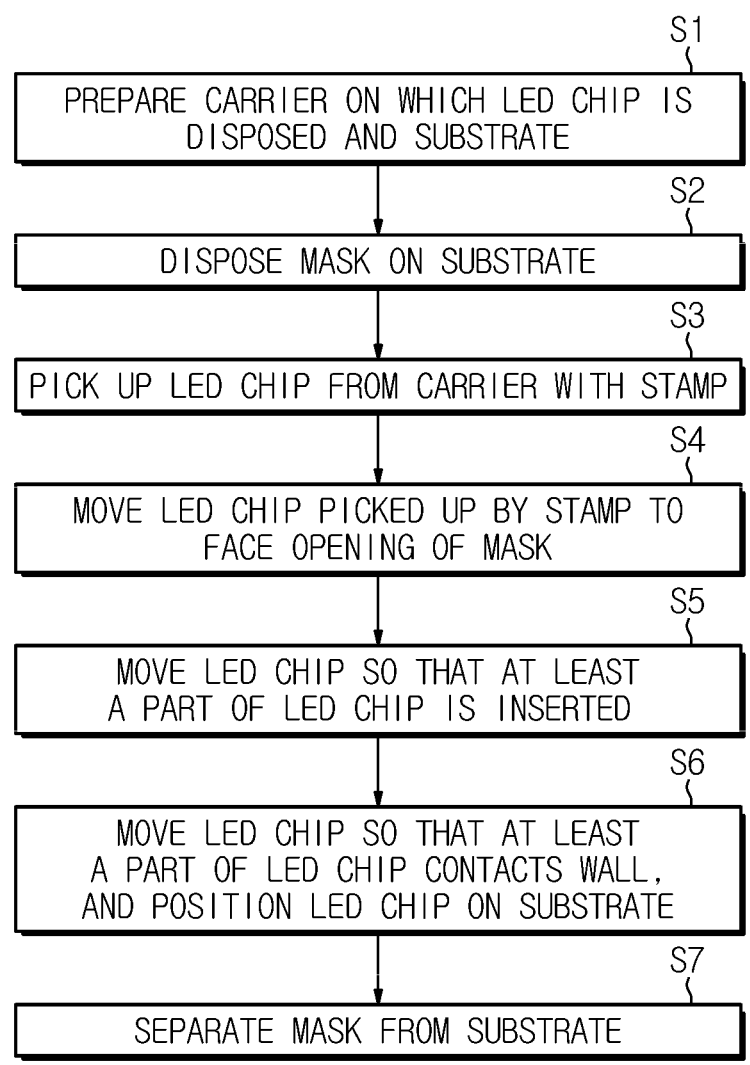
FIG. 2 is a flowchart illustrating an LED module manufacturing method according to a first embodiment.
Figure 3:
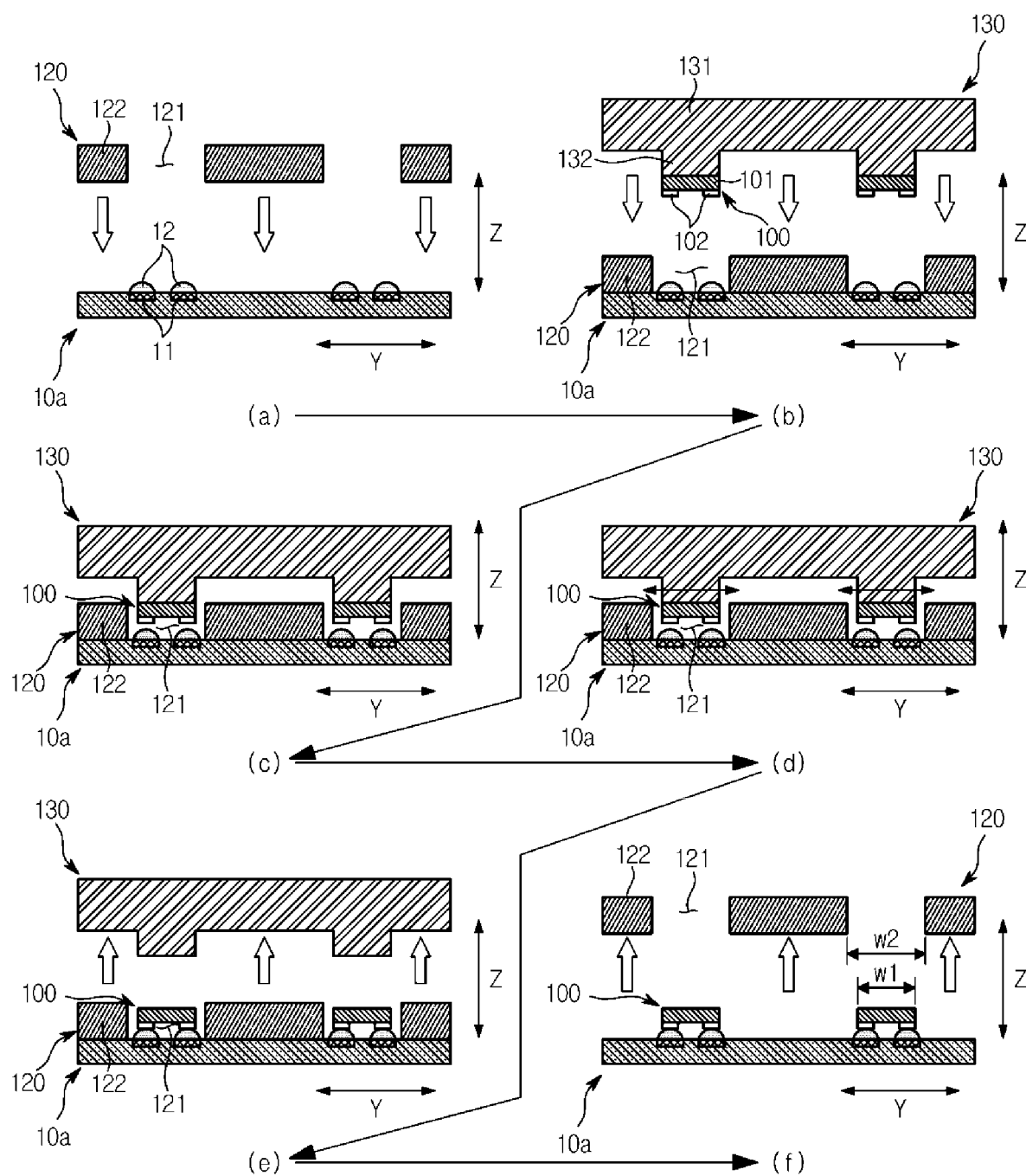
FIG. 3 is a view illustrating a process of positioning an LED chip on a substrate in the LED module manufacturing method according to the first embodiment.

FIG. 2 is a flowchart illustrating an LED module manufacturing method according to a first embodiment of the present disclosure, and FIG. 3 is a view showing a process of positioning an LED chip on a substrate in the LED module manufacturing method according to the first embodiment.

As shown in FIGS. 2 and 3, the LED module manufacturing method according to the first embodiment may include an operation 51 of preparing a carrier 110 (see FIG. 14) on which the LED chip 100 is disposed and a substrate 10a.

The substrate 10a may include the electrode 11. The electrode 11 provided on the substrate 10a may include a positive (+) electrode and a negative (−) electrode. The positive (+) electrode of the substrate 10a may be electrically connected to a negative (−) electrode of the LED chip 100, and the negative (−) electrode of the substrate 10a may be electrically connected to the positive (+) electrode of the LED chip 100.

The substrate 10a may further include the solder 12. The solder 12 may be disposed on the electrode 11, and function to electrically connect the electrode 11 of the substrate 10a to the electrode 102 of the LED chip 100. For example, the solder 12 may be formed in the shape of a solder bump. Alternatively, the solder 12 may be formed in the shape of a layer.

The LED module manufacturing method may further include an operation S2 of disposing a mask 120 on the substrate 10a.

The mask 120 may be disposed on one surface of the substrate 10a on which the electrode 11 and the solder 12 are disposed. In other words, the mask 120 may be disposed on the substrate 10a to be positioned between the substrate 10a and a stamp 130. The mask 120 may include an opening 121 and a wall 122. The wall 122 may define the opening 121. The mask 120 may be formed of a rigid material. For example, the mask 120 may be formed of a metal material.

The LED module manufacturing method may further include an operation S3 of picking up the LED chip 100 from the carrier 110 with the stamp 130.

The stamp 130 may be formed of an elastic material to minimize an impact that may be applied to the LED chip 100 in a process of picking up the LED chip 100. For example, the stamp 130 may be formed of polydimethylsiloxane (PDMS). However, the stamp 130 may be formed of any other material as long as it can cushion an impact that may be applied to the LED chip 100. The stamp 130 may include a body 131, and a protrusion 132 protruding from the body 131. The protrusion 132 may include an adhesive surface. The LED chip 100 disposed on the carrier 110 may be picked up by being adhered to the stamp 130 approaching the carrier 110. More specifically, the LED chip 100 may be adhered to the adhesive surface of the protrusion 132.

The stamp 130 can pick up the plurality of LED chips 100 all at once from the carrier 110. More specifically, the stamp 130 may include a plurality of protrusions 132 corresponding to the number of the plurality of LED chips 100 that are to be picked up from the carrier 110. Also, the protrusions 132 of the stamp 130 may be located to correspond to locations of the plurality of the LED chips 110 that are to be picked up from the carrier 110. The plurality of LED chips 100 may be picked up from the carrier 110 and positioned on the substrate 10a in a unit of a module 2 shown in FIG. 1. For example, the LED module 1 shown in FIG. 1 may be configured with four modules 2. However, the LED module 1 may be configured with five or more modules or with three or less modules 2. That is, the LED module 1 may be configured with one or more modules 2.

The LED module manufacturing method may further include an operation S4 of moving the LED chip 100 picked up by the stamp 130 to face the opening 121 of the mask 120. For example, the LED chip 100 picked up by the stamp 130 may move together with the stamp 130 to face the opening 121 of the mask 120. In other words, the LED chip 100 picked up by the stamp 130 may move toward the substrate 10a in a state in which it is attached to the stamp 130.

The LED module manufacturing method may further include an operation S5 of moving the LED chip 100 so that at least a part of the LED chip 100 is inserted into the opening 121. More specifically, the LED module manufacturing method may further include operation of moving the LED chip 100 in a first direction Z until the at least a part of the LED chip 100 is inserted into the opening 121. For example, the LED chip 100 may move together with the stamp 130 so that the at least a part of the LED chip 100 is inserted into the opening 121 of the mask 120.

The LED module manufacturing method may further include an operation S6 of moving the LED chip 100 until the at least a part of the LED chip 100 contacts the wall 122, and positioning the LED chip 100 on the substrate 10a. More specifically, the LED module manufacturing method may further include an operation of moving the LED chip 100 in a second direction Y until the at least a part of the LED chip 100 contacts the wall 122. In other words, the LED module manufacturing method may further include an operation of separating the LED chip 100 from the stamp 130 by moving the LED chip 100 until the at least a part of the LED chip 100 collides with the wall 122. At this time, the LED chip 100 may collide with the wall 122 with an intensity that does not damage the LED chip 100 by an impact applied when the LED chip 100 collides with the wall 122. In another aspect, the LED module manufacturing method may further include an operation of linearly moving or turning the stamp 130 after the at least a part of the LED chip 100 is inserted into the opening 121. The LED chip 100 picked up by the stamp 100 may move toward the substrate 10a in the state of being attached to the stamp 130. By linearly moving or turning the stamp 130 after the at least a part of the LED chip 100 is inserted into the opening 121, the LED chip 100 may be separated from the stamp 130.

During the process of linearly moving or turning the stamp 130, the LED chip 100 attached to the stamp 130 and moving together with the stamp 130 may contact or collide with the wall 122. Accordingly the LED chip 100 may be separated from the stamp 130, and disposed or positioned on the substrate 10a.

The LED module manufacturing method may further include an operation S7 of separating the mask 120 from the substrate 10a. After the LED chip 100 is disposed on the substrate 10a, the mask 120 may be removed from the substrate 10a.

The LED module 1 manufactured by the LED module manufacturing method according to the first embodiment may be subject to various processes, such as curing, molding, and cutting, and then applied to a display apparatus. Hereinafter, processes for manufacturing the LED module will be sequentially described with reference to FIG. 3.

As shown in (a) of FIG. 3, the mask 120 may be disposed on the substrate 10a. The mask 120 may be lifted or lowered in a first direction Z. As shown in (a) of FIG. 3, the mask 120 may be lowered in the first direction Z to be disposed on the substrate 10a. The mask 120 may include the opening 121, and the wall 122 provided to define the opening 121.

As shown in (b) of FIG. 3, the stamp 130 to which the LED chip 100 is attached may approach the substrate 10a. The stamp 130 may be lifted or lowered in the first direction Z. As shown in (b) of FIG. 3, the stamp 130 may be lowered in the first direction Z to approach the substrate 10a. The LED chip 100 may be attached to the protrusion 132 of the stamp 130. More specifically, the electrode 102 of the LED chip 100 may be attached on the protrusion 132 of the mask 120 to face the electrode 11 of the substrate 10a so as to be electrically connected to the electrode 11 of the substrate 10a.

As shown in (c) of FIG. 3, the stamp 130 may be moved so that the at least a part of the LED chip 100 attached on the stamp 130 is inserted into the opening 121 of the mask 120. At this time, the LED chip 100 and the opening 121 of the mask 120 may be aligned on the same line in the first direction Z.

As shown in (d) of FIG. 3, after the at least a part of the LED chip 100 is inserted into the opening 121 of the mask 120, the stamp 130 may move so that the at least a part of the LED chip 100 contacts the wall 122 of the mask 120. The stamp 130 may move to the left or right in the second direction Y. If the stamp 130 moves to the left in the second direction Y, the LED chip 100 attached on the stamp 130 may contact or collide with the wall 122 located to the left of the opening 121 with respect to the opening 121 into which the at least a part of the LED chip 100 is inserted. At this time, the stamp 130 may move to the left in the second direction Y, but the LED chip 100 attached on the stamp 130 may be prevented from moving by the wall 122 located to the left of the opening 121. Accordingly, the LED chip 100 may be separated from the stamp 130, and rested on the solder 12 of the substrate 10a exposed to the outside through the opening 121. If the stamp 130 moves to the right in the second direction Y, the LED chip 100 attached on the stamp 130 may contact or collide with the wall 122 located to the right of the opening 121 with respect to the opening 121 into which the at least a part of the LED chip 100 is inserted. At this time, the stamp 130 may move to the right in the second direction Y, but the LED chip 100 attached on the stamp 130 may be prevented from moving by the wall 122 located to the right of the opening 121. Accordingly, the LED chip 100 may be separated from the stamp 130, and rested on the solder 12 of the substrate 10a exposed to the outside through the opening 121.

As shown in (e) of FIG. 3, after the LED chip 100 is rested on the substrate 10a, the stamp 130 may move to increase a distance between the stamp 130 and the substrate 10a. More specifically, the stamp 130 may be lifted in the first direction Z to move away from the substrate 10a.

As shown in (f) of FIG. 3, the mask 120 may be separated from the substrate 10a. More specifically, the mask 120 may be lifted in the first direction Z and separated from the substrate 10a.

Hereinafter, an LED module manufacturing apparatus will be described according to an exemplary embodiment.

The LED module manufacturing apparatus may include the carrier 110. The LED chip 100 may be disposed on one surface of the carrier 110. More specifically, the carrier 110 may have an adhesive surface, and the LED chip 100 may be adhered on the adhesive surface of the carrier 110.

The LED module manufacturing apparatus may further include the substrate 10a. The substrate 10a may be preferably disposed adjacent to the carrier 110. The substrate 10a may include the electrode 11. The electrode 11 may include the positive (+) electrode and the negative (−) electrode. The substrate 10a may further include the solder 12. The solder 12 may electrically connect the electrode 102 of the LED chip 100 to the electrode 11 of the substrate 10a.

The LED module manufacturing apparatus may further include the stamp 130. The stamp 130 may move to pick up the LED chip 100 from the carrier 110 and place the LED chip 100 on the substrate 10a. The stamp 130 may include the body 131, and the protrusion 132 protruding from the body 131. The stamp 130 may have the adhesive surface. More specifically, the adhesive surface of the stamp 130 may be formed on the protrusion 132, and the LED chip 100 picked up from the carrier 110 may be adhered on the adhesive surface of the protrusion 132. The stamp 130 may linearly move or turn to make the LED chip 100 contact or collide with the wall 122 of the mask 120 to separate the LED chip 100 from the stamp 130. The LED chip 100 separated from the stamp 130 may be positioned on the substrate 10a.

The LED module manufacturing apparatus may further include a stamp driver (not shown) for moving the stamp 130. The stamp 130 may be connected to the stamp driver to receive a driving force from the stamp driver.

The LED module manufacturing apparatus may further include the mask 120 detachably disposed on the substrate 10a. The mask 120 may include the opening 121, and the wall 122 defining the opening 121.

The first direction Z may be perpendicular to the second direction Y, although not limited thereto.

Figure 4:
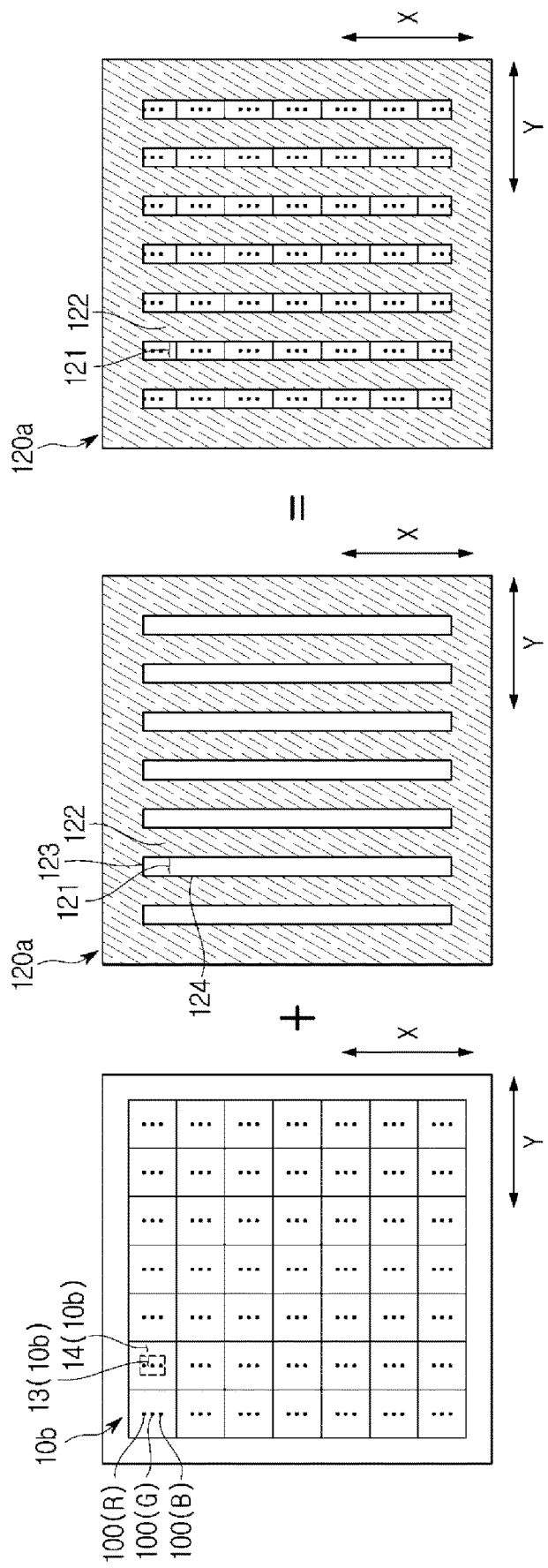
FIG. 4 is a view illustrating shapes of a substrate and a mask according to the first embodiment in the LED module manufacturing method according to the first embodiment.
Figure 5:
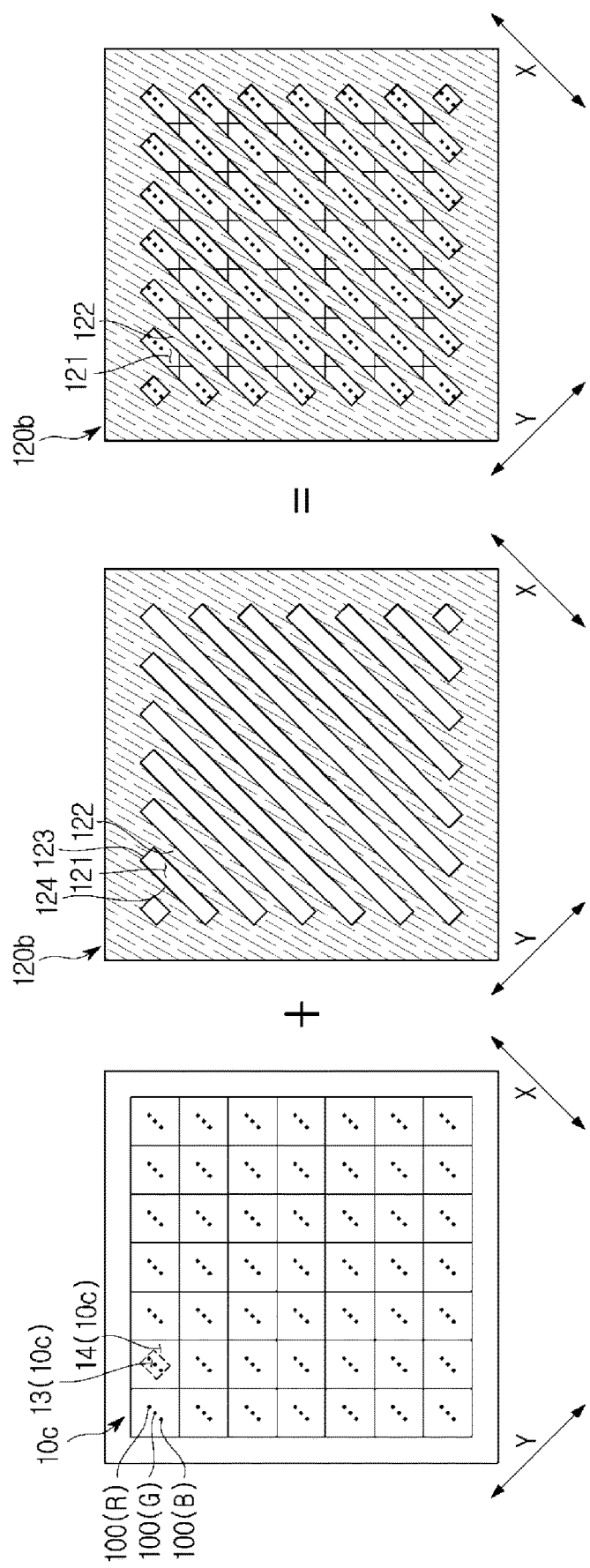
FIG. 5 is a view illustrating shapes of a substrate and a mask according to a second embodiment in the LED module manufacturing method according to the first embodiment.
Figure 6:
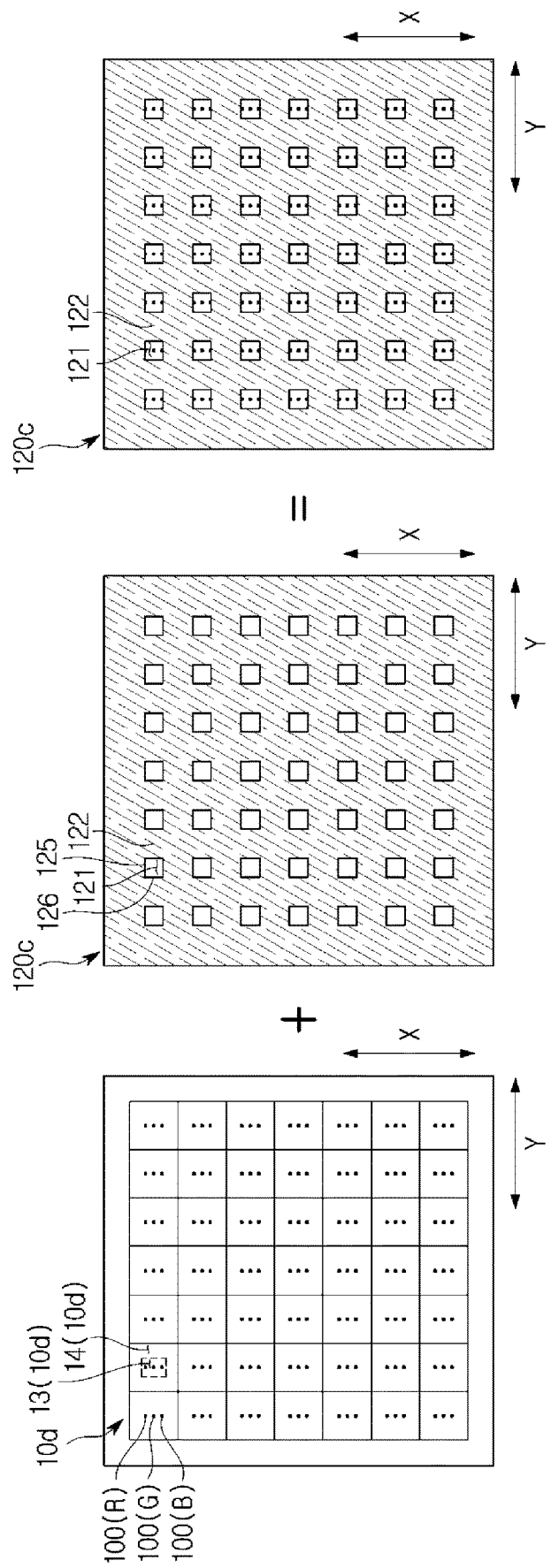
FIG. 6 is a view illustrating shapes of a substrate and a mask according to a third embodiment in the LED module manufacturing method according to the first embodiment.
Figure 7:
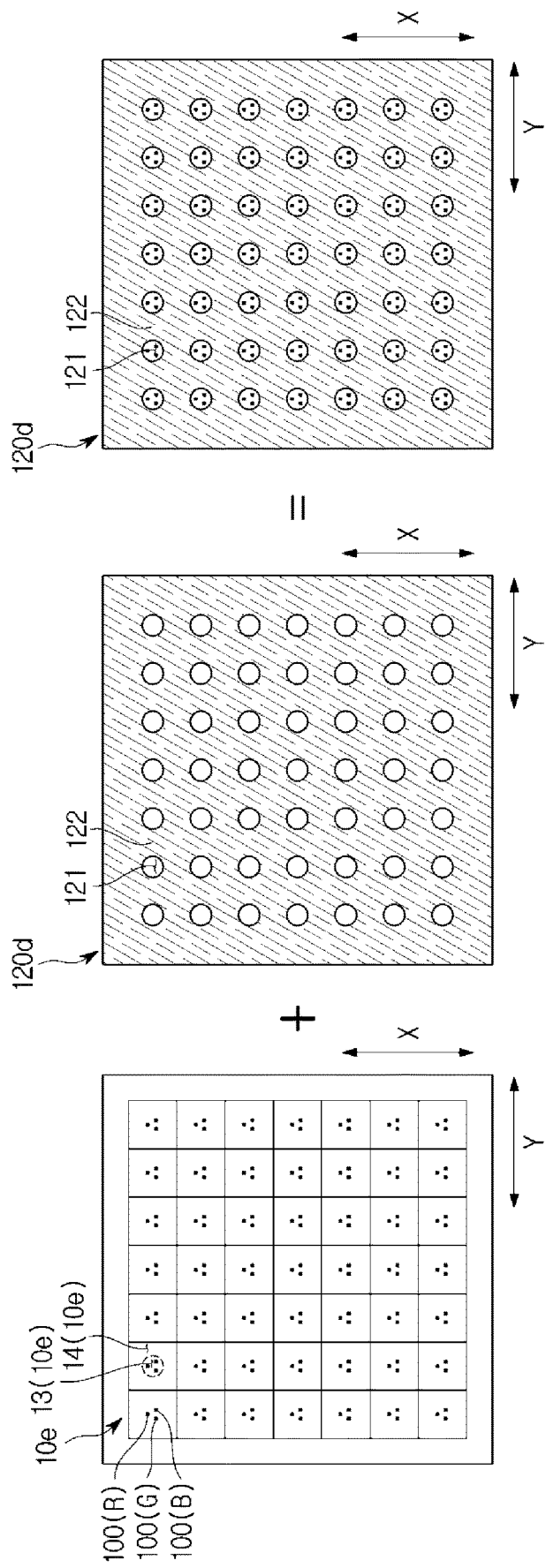
FIG. 7 is a view illustrating shapes of a substrate and a mask according to a fourth embodiment in the LED module manufacturing method according to the first embodiment.
Figure 8:
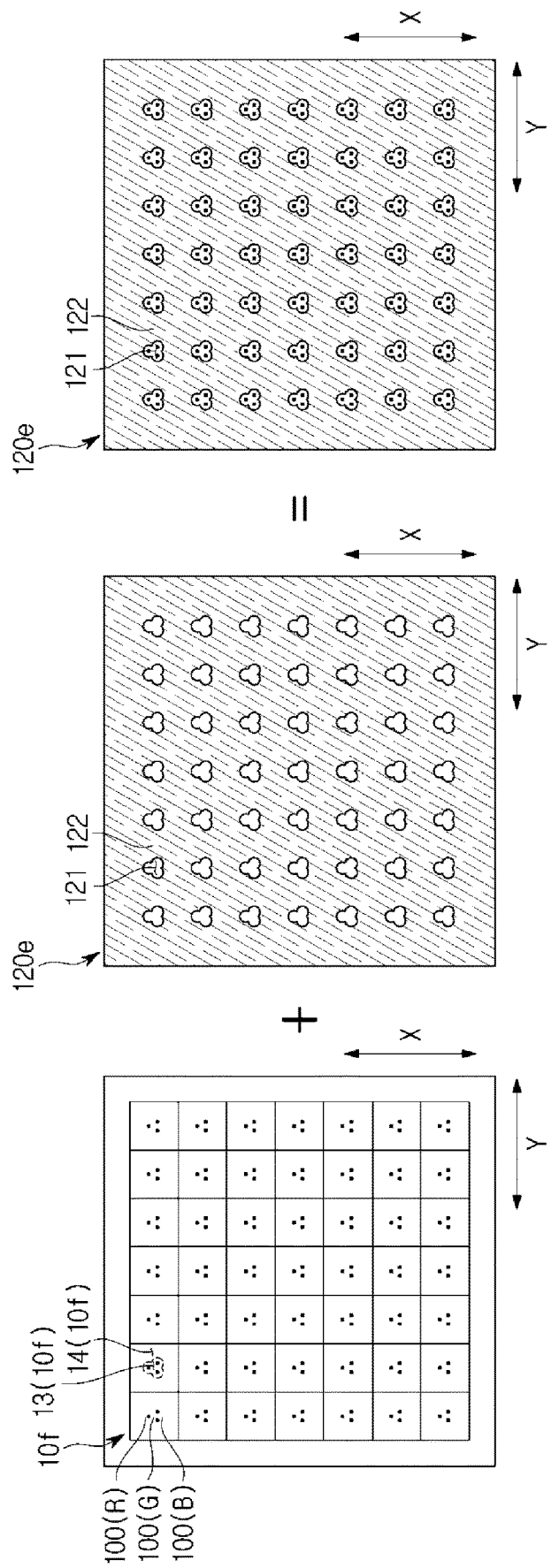
FIG. 8 is a view illustrating shapes of a substrate and a mask according to a fifth embodiment in the LED module manufacturing method according to the first embodiment.

FIG. 4 is a view illustrating shapes of a substrate and a mask according to a first embodiment in the LED module manufacturing method according to the first embodiment, and FIG. 5 is a view illustrating shapes of a substrate and a mask according to a second embodiment in the LED module manufacturing method according to the first embodiment. FIG. 6 is a view illustrating shapes of a substrate and a mask according to a third embodiment in the LED module manufacturing method according to the first embodiment, and FIG. 7 is a view illustrating shapes of a substrate and a mask according to a fourth embodiment in the LED module manufacturing method according to the first embodiment. FIG. 8 is a view illustrating shapes of a substrate and a mask according to a fifth embodiment in the LED module manufacturing method according to the first embodiment. The masks and substrates shown in FIGS. 4 to 8 may be used in the LED module manufacturing method according to the second embodiment, the LED module manufacturing method according to the third embodiment, the LED module manufacturing method according to the fourth embodiment, and the LED module manufacturing method according to the fifth embodiment, as well as in the LED module manufacturing method according to the first embodiment.

As shown in FIGS. 4 to 8, the masks and the substrates may have various shapes. The shapes of the masks may correspond to the shapes of the substrates. More specifically, the masks may have shapes corresponding to arrangement patterns of LED chips disposed on the substrates. Hereinafter, various shapes of the masks and the substrates will be described.

As shown in FIG. 4, a substrate 10b may include a first area 13 and a second area 14. The LED chip 100 may be mounted on the first area 13 of the substrate 10b. The second area 14 of the substrate 10b may be provided to define the first area 13. As an example, the first area 13 may be surrounded by the second area 14. In addition, the second area 14 of the substrate 10b may be disposed adjacent to the first area 13. The plurality of LED chips 100 may be mounted on the first area 13 of the substrate 10b in units of modules. A red LED chip R, a green LED chip G, and a blue LED chip B may constitute a module unit.

A mask 120a may be applied to the substrate 10b. More specifically, the mask 120a may be disposed on the substrate 10b in such a way to be able to be used to locate the LED chip 100 on the substrate 10b. The mask 120a may include the opening 121. The opening 121 may be formed to expose the first area 13 of the substrate 10b to the outside when the mask 120a is disposed on the substrate 10b. The LED chip 100 may be mounted on the first area 13 of the substrate 10b through the opening 121 of the mask 120a. The mask 120a may further include the wall 122. The wall 122 may define the opening 121. The wall 122 may be positioned on the second area 14 when the mask 120a is disposed on the substrate 10b.

The opening 121 and the wall 122 may be alternately arranged. More specifically, the opening 121 and the wall 122 may be alternately arranged in the second direction Y.

The opening 121 may be in the shape of a closed loop formed along the periphery of the LED chip 100. For example, the opening 121 may be in the shape of a closed loop formed along the periphery of a plurality of LED chips 100 in a module unit. As another example, the opening 121 may be in the shape of a closed loop formed along the periphery of each of the plurality of LED chips 100. As still another example, the opening 121 may be in the shape of a closed loop formed along the periphery of a plurality of LED chips 100 forming a row or column in the second direction Y or in a third direction X. FIG. 4 shows the opening 121 being in the shape of a closed loop formed along the periphery of the plurality of LED chips 100 forming a row or column in the third direction X. As shown in FIG. 4, the second direction Y may be perpendicular to the third direction X.

The opening 121 may include a shorter side 123 extending in the second direction Y and a longer side 124 extending in the third direction X. FIG. 4 shows the opening 121 having a rectangular shape.

A width of the opening 121 may be larger than that of the LED chip 100 (see (f) of FIG. 3). Preferably, the width of the opening 121 may be 120% of that of the LED chip 100 measured in the second direction Y. In other words, the shorter side 123 of the opening 121 may have a length corresponding to 120% of the width of the LED chip 100 measured in the second direction Y.

As shown in FIG. 5, a substrate 10c may include the first area 13 and the second area 14. A detailed description about the substrate 10c will be omitted because it overlaps with the above description given with reference to FIG. 4.

A mask 120b may include the opening 121 and the wall 122. A detailed description about the mask 120b will also be omitted because it overlaps with the above description given with reference to FIG. 4.

The opening 121 and the wall 122 may be alternately disposed. More specifically, the opening 121 and the wall 122 may be alternately disposed in the second direction Y, which is a different direction from the second direction Y in FIG. 4.

The opening 121 may be in the shape of a closed loop formed along the periphery of the LED chip 100. For example, the opening 121 may be in the shape of a closed loop shape formed along the periphery of a plurality of LED chips 100 in a module unit. As another example, the opening 121 may be in the shape of a closed loop formed along the periphery of each of the plurality of LED chips 100. As still another example, the opening 121 may be in the shape of a closed loop formed along the periphery of a plurality of LED chips 100 forming a rows or column in the second direction Y in which the stamp 130 moves when at least one LED chip 100 is inserted into the opening 121, or in the third direction X. FIG. 5 shows the opening 121 being in the shape of a closed loop formed along the periphery of the plurality of LED chips 100 forming a row or column in the third direction X. Herein, the third direction X may be perpendicular to the second direction Y.

The opening 121 may include the shorter side 123 extending in the second direction Y and the longer side 124 extending in the third direction X. FIG. 5 shows the opening 121 having a rectangular shape. In FIG. 4, the plurality of openings 121 have the same size, whereas in FIG. 5, the plurality of openings 121 have different sizes. In an exemplary embodiment, the plurality of openings 121 increase in size from the peripheries of the substrate 10c to the middle of the substrate 10c.

A width of the opening 121 may be larger than that of the LED chip 100 (see (f) of FIG. 3). Preferably, the width of the opening 121 may be 120% of that of the LED chip 100 measured in the second direction Y. In other words, the shorter side 123 of the opening 121 may have a length corresponding to 120% of the width of the LED chip 100 measured in the second direction Y.

As shown in FIG. 6, a substrate 10d may include the first area 13 and the second area 14. A detailed description about the substrate 10d will be omitted because it overlaps with the above description given with reference to FIG. 4.

A mask 120c may include the opening 121 and the wall 122. A detailed description about the mask 120c will be omitted because it overlaps with the above description given with reference to FIG. 4.

The plurality of openings 121 and the plurality of walls 122 may be arranged in a grid pattern.

The opening 121 may be in the shape of a closed loop formed along the periphery of the LED chip 100. FIG. 6 shows the opening 121 being in the shape of a closed loop formed along the periphery of a plurality of LED chips 100 in a module unit.

The opening 121 may include a first side 125 extending in the second direction Y, and a second side 126 extending in the third direction X and having the same length as the first side 125. FIG. 6 shows the opening 121 being in the shape of a square.

A width of the opening 121 may be larger than the width of the LED chip 100 (see (f) of FIG. 3). Preferably, the width of the opening 121 may be 120% of that of the LED chip 100 measured in the second direction Y. In other words, the first side 125 and the second side 126 of the opening 121 may have a length corresponding to 120% of the width of the LED chip 100 measured in the second direction Y.

As shown in FIG. 7, a substrate 10e may include the first area 13 and the second area 14. A detailed description about the substrate 10e will be omitted because it overlaps with the above description given with reference to FIG. 4.

A mask 120d may include the opening 121 and the wall 122. A detailed description about the mask 120d will also be omitted because it overlaps with the above description given with reference to FIG. 4.

The opening 121 may include a curved portion.

The opening 121 may be in the shape of a closed loop formed along the periphery of the LED chip 100. FIG. 7 shows the opening 121 being in the shape of a closed loop formed along the periphery of a plurality of LED chips 100 in a module unit. FIG. 7 shows the opening 121 being in the shape of a circle. In FIG. 7, the plurality of openings 121 of the mask 120d have the same size. However, it may also be possible to design the mask 120d having the openings 121 of different sizes.

A width of the opening 121 may be larger than that of the LED chip 100 (see (f) of FIG. 3). That is, a diameter of the opening 121 may be larger than the width of the LED chip 100.

As shown in FIG. 8, a substrate 10f may include the first area 13 and the second area 14. A detailed description about the substrate 10f will be omitted because it overlaps with the above description given with reference to FIG. 4.

A mask 120e may include the opening 121 and the wall 122. A detailed description about the mask 120e will also be omitted because it overlaps with the above description given with reference to FIG. 4.

The opening 121 may include a curved portion.

The opening 121 may be in the shape of a closed loop formed along the periphery of the LED chip 100. FIG. 8 shows the opening 121 being in the shape of a closed loop formed along the periphery of a plurality of LED chips 100 in a module unit. FIG. 8 shows the opening 121 being in the shape of a clover. In FIG. 8, the plurality of openings 121 of the mask 120e have the same size. However, it may also be possible to design the mask 120e having the openings 121 of different sizes.

A width of the opening 121 may be larger than that of the LED chip 100.

Figure 9:
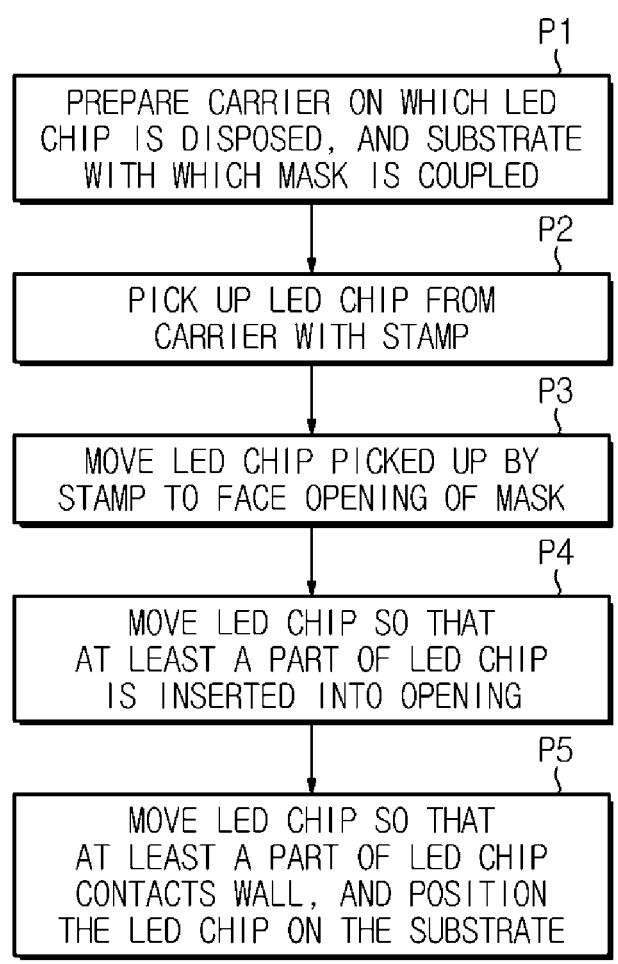
FIG. 9 is a flowchart illustrating an LED module manufacturing method according to a second embodiment.
Figure 10:
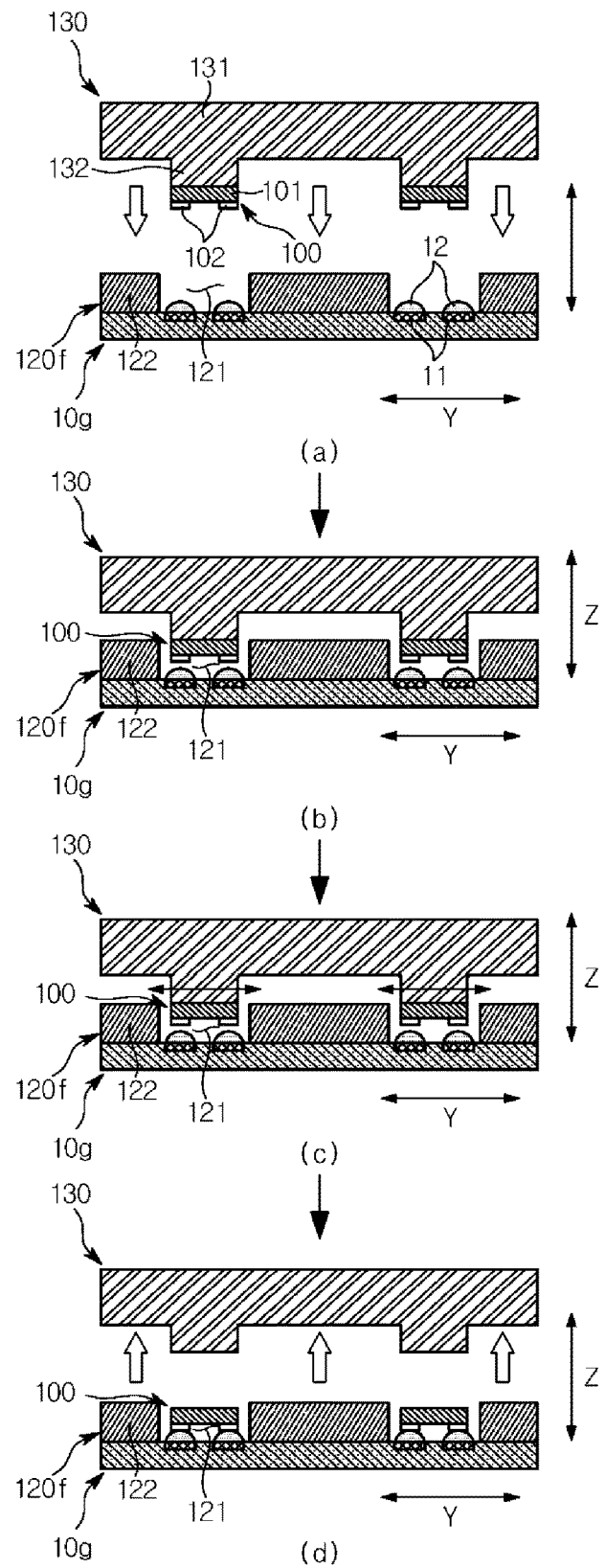
FIG. 10 is a view illustrating a process of positioning an LED chip on a substrate in the LED module manufacturing method according to the second embodiment.

FIG. 9 is a flowchart illustrating an LED module manufacturing method according to a second embodiment, and FIG. 10 is a view showing a process of positioning an LED chip on a substrate in the LED module manufacturing method according to the second embodiment. Hereinafter, descriptions overlapping with those described in the LED module manufacturing method according to the first embodiment will be omitted.

As shown in FIGS. 9 and 10, the LED module manufacturing method according to the second embodiment may include an operation P1 of preparing the carrier 110 on which the LED chip 100 is disposed, and a substrate 10g to which a mask 120f is coupled. The mask 120f may include the opening 121 and the wall 122. The mask 120f may be integrated into the substrate 10g. The mask 120f may be formed of a rigid material.

The LED module manufacturing method may further include an operation P2 of picking up the LED chip 100 from the carrier 110 with the stamp 130.

The LED module manufacturing method may further include an operation P3 of moving the LED chip 100 picked up by the stamp 130 to face the opening 121 of the mask 120f.

The LED module manufacturing method may further include an operation P4 of moving the LED chip 100 so that the at least a part of the LED chip 100 is inserted into the opening 121.

The LED module manufacturing method may further include operation P5 of moving the LED chip 100 so that the at least a part of the LED chip 100 contacts the wall 122 to position the LED chip 100 on the substrate 10g.

The LED module 1 manufactured by the LED module manufacturing method according to the second embodiment may be subject to various processes, such as curing, molding, and cutting, and then applied to a display apparatus. Hereinafter, processes for manufacturing the LED module will be sequentially described with reference to FIG. 10.

As shown in (a) of FIG. 10, the stamp 130 on which the LED chip 100 is attached may approach the substrate 10g with which the mask 120f is coupled. The stamp 130 may be lifted or lowered in the first direction Z. As shown in (a) of FIG. 10, the stamp 130 may be lowered in the first direction Z to approach the substrate 10g.

As shown in (b) of FIG. 10, the stamp 130 may move so that at least a part of the LED chip 100 attached on the stamp 130 is inserted into the opening 121 of the mask 120f. At this time, the LED chip 100 and the opening 121 of the mask 120f may be positioned on the same line in the first direction Z.

As shown in (c) of FIG. 10, after the at least a part of the LED chip 100 is inserted into the opening 121 of the mask 120f, the stamp 130 may move until the at least a part of the LED chip 100 contacts the wall 122 of the mask 120f. Then, the stamp 130 may move to the left or right in the second direction Y.

As shown in (d) of FIG. 10, after the LED chip 100 is positioned on the substrate 10g, the stamp 130 may move to increase a distance between the stamp 130 and the substrate 10g. More specifically, the stamp 130 may be lifted in the first direction Z to move away from the substrate 10g.

In the LED module manufacturing method according to the second embodiment, the mask 120f may be separated from the substrate 10g, and coupled with the substrate 10g when it is used. However, the mask 120f may be integrated into the substrate 10g. In this case, one of structures disposed on the substrate 10g may serve as the wall 122 of the mask 120f. As described above, when the mask 120f is formed integrally with the substrate 10g, the process of positioning the mask 120f on the substrate 10g and the process of removing the mask 120f from the substrate 10g can be omitted, thereby a process for manufacturing the LED module may become simple.

Figure 11:
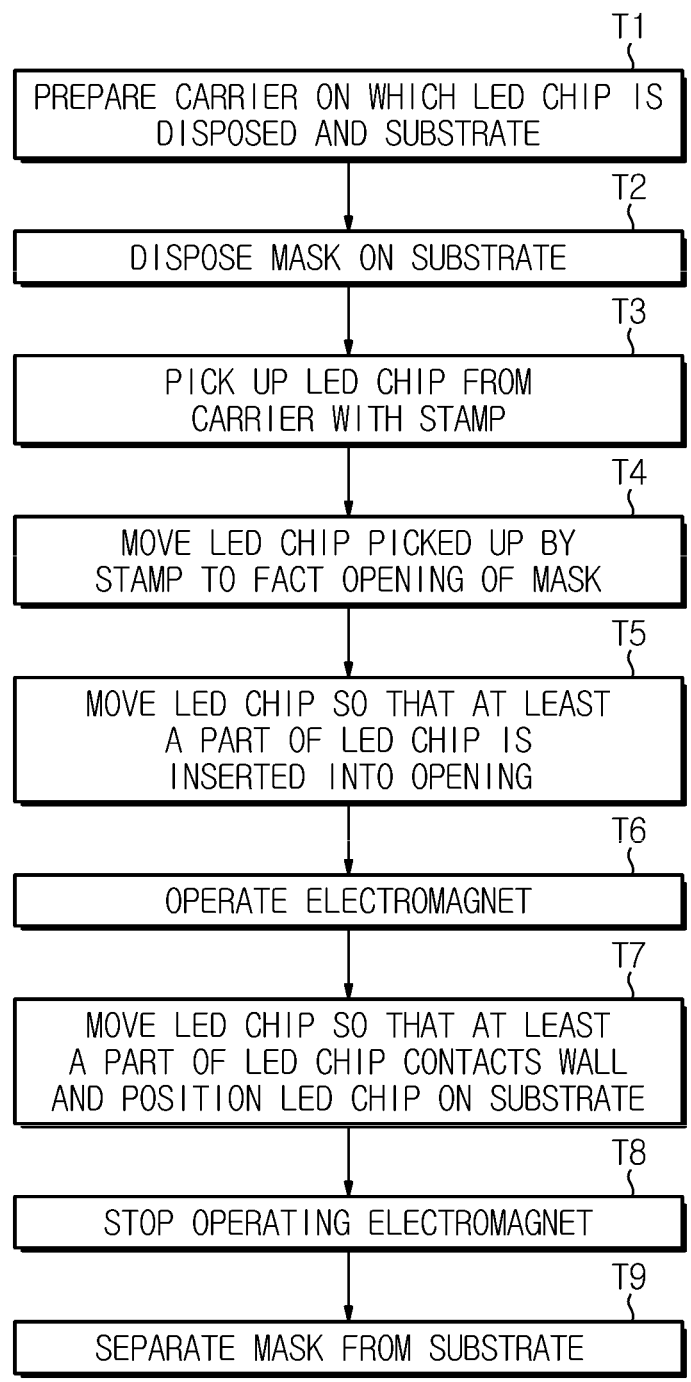
FIG. 11 is a flowchart illustrating an LED module manufacturing method according to a third embodiment.
Figure 12:
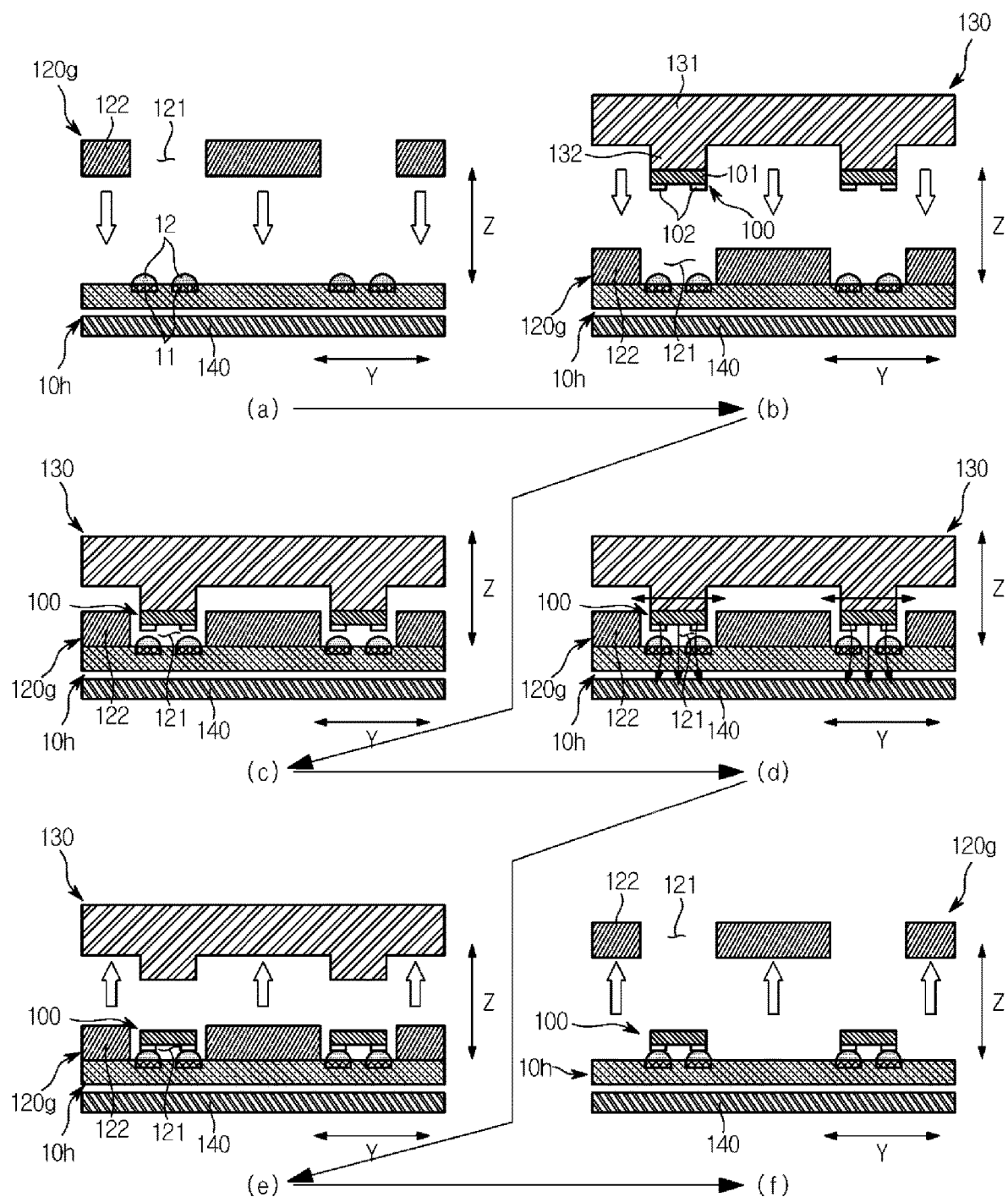
FIG. 12 is a view illustrating a process of positioning an LED chip on a substrate in the LED module manufacturing method according to the third embodiment.

FIG. 11 is a flowchart illustrating an LED module manufacturing method according to a third embodiment, and FIG. 12 is a view showing a process of positioning an LED chip on a substrate in the LED module manufacturing method according to the third embodiment. Hereinafter, descriptions overlapping with those described in the LED module manufacturing method according to the first embodiment will be omitted.

As shown in FIGS. 11 and 12, the LED module manufacturing method according to the third embodiment may include an operation T1 of preparing the carrier 110 on which the LED chip 100 is disposed, and a substrate 10h.

The LED module manufacturing method may further include an operation T2 of disposing a mask 120g on the substrate 10h.

The LED module manufacturing method may further include an operation T3 of picking up the LED chip 100 from the carrier 110 with the stamp 130.

The LED module manufacturing method may further include an operation T4 of moving the LED chip 100 picked up by the stamp 130 to face the opening 121 of the mask 120g.

The LED module manufacturing method may further include an operation T5 of moving the LED chip 100 so that at least a part of the LED chip 100 is inserted into the opening 121.

The LED module manufacturing method may further include an operation T6 of operating an electromagnet 140. In other words, the LED module manufacturing method may further include an operation of applying a magnetic force to the LED chip 100.

The LED module manufacturing method may further include an operation T7 of moving the LED chip 100 so that the at least a part of the LED chip 100 contacts the wall 122 to position the LED chip 100 on the substrate 10h.

The LED module manufacturing method may further include an operation T8 of stopping operating the electromagnet 140.

The LED module manufacturing method may further include an operation T9 of separating the mask 120g from the substrate 10h.

The LED module 1 manufactured by the LED module manufacturing method according to the third embodiment may be subject to various processes, such as curing, molding, and cutting, and then applied to a display apparatus.

Hereinafter, processes for manufacturing the LED module will be sequentially described with reference to FIG. 12.

As shown in (a) of FIG. 12, a mask 120g may be disposed on the substrate 10h. The mask 120g may be lifted or lowered along the first direction Z. As shown in (a) of FIG. 12, the mask 120g may be disposed on the substrate 10h by being lowered in the first direction Z.

As shown in (b) of FIG. 12, the stamp 130 to which the LED chip 100 is attached may approach the substrate 10h. The stamp 130 may be lifted or lowered in the first direction Z. As shown in (b) of FIG. 12, the stamp 130 may be lowered in the first direction Z to approach the substrate 10h.

As shown in (c) of FIG. 12, the stamp 130 may move so that at least a part of the LED chip 100 attached on the stamp 130 is inserted into the opening 121 of the mask 120g.

As shown in (d) of FIG. 12, after the at least a part of the LED chip 100 is inserted into the opening 121 of the mask 120g, the electromagnet 140 may operate. Further, after the at least a part of the LED chip 100 is inserted into the opening 121 of the mask 120g, the stamp 130 may move until at least a part of the LED chip 100 contacts the wall 122 of the mask 120g. Then, the stamp 130 may move to the left or right in the second direction Y. The operation of operating the electromagnet 140 and the operation of moving the stamp 130 to make the at least a part of the LED chip 100 contact the wall 122 may be performed simultaneously or sequentially.

As shown in (e) of FIG. 12, after the LED chip 100 is positioned on the substrate 10h, the electromagnet 140 may stop operating. That is, after the LED chip 100 is positioned on the substrate 10h, the electromagnet 140 may no longer generate the magnetic force. Further, after the LED chip 100 is positioned on the substrate 10h, the stamp 130 may move to increase a distance between the stamp 130 and the substrate 10h. More specifically, the stamp 130 may be lifted in the first direction Z to move away from the substrate 10h. The operation of stopping operating the electromagnet 140 and the operation of moving the stamp 130 may be performed simultaneously or sequentially.

As shown in (f) of FIG. 12, the mask 120g may be separated from the substrate 10h. More specifically, the mask 120g may be lifted along the first direction Z and separated from the substrate 10h.

Hereinafter, an LED module manufacturing apparatus will be described as follows.

The LED module manufacturing apparatus may further include the electromagnet 140. The electromagnet 140 may be disposed adjacent to the substrate 10h so that the LED chip 100 is separated from the stamp 130 and positioned on the substrate 10h. For example, the electromagnet 140 may be disposed under the substrate 10h. In another aspect, the electromagnet 140 may be disposed to face the stamp 130 with the substrate 10h in between. The electromagnet 140 may be fixed on a lower portion of the substrate 10h. Also, the electromagnet 140 may be detachably disposed.

In the LED module manufacturing method according to the third embodiment, the LED chip 100 may include a material responding to a magnetic force. That is, in the LED module manufacturing method according to the third embodiment, the LED chip 100 may include a material capable of interacting with the electromagnet 140.

According to the LED module manufacturing method according to the third embodiment, by operating the electromagnet 140 to apply a magnetic force to the LED chip 100, in addition to making the LED chip 100 contact the wall 122 of the mask 120g to separate the LED chip 100 from the stamp 130, an additional attractive force may be applied to the LED chip 100 by the electromagnet 140 toward the substrate 10h. Therefore, the LED chip 100 can be more effectively separated from the stamp 130 and positioned on the substrate 10h. According to an exemplary embodiment, by having an additional attractive force from the electromagnet 140, the LED chip separates from the stamp more easily and is positioned more accurately on the substrate 10h.

Figure 13:
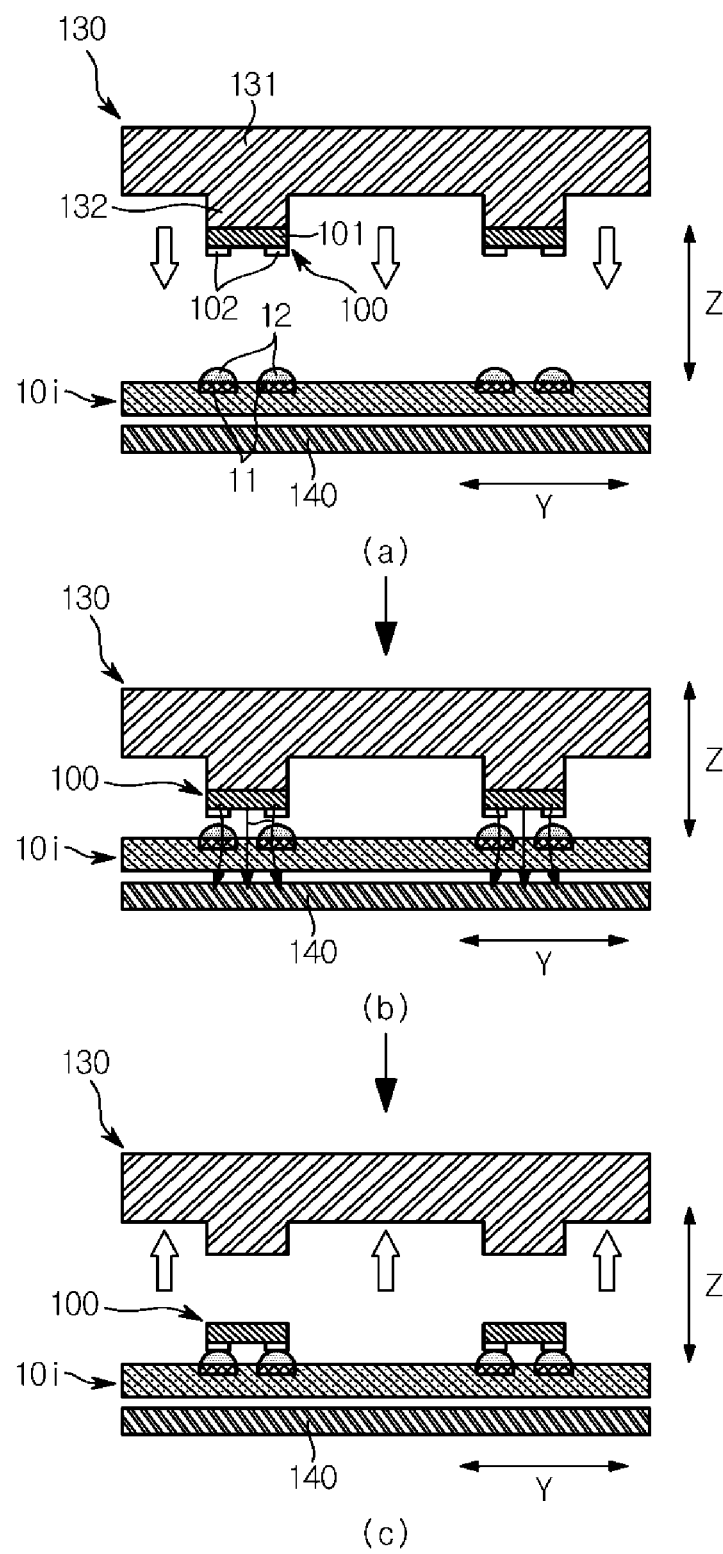
FIG. 13 is a view illustrating a process of positioning an LED chip on a substrate in an LED module manufacturing method according to a fourth embodiment.

FIG. 13 is a view showing a process of positioning an LED chip on a substrate in an LED module manufacturing method according to a fourth embodiment. Hereinafter, descriptions overlapping with those described in the LED module manufacturing method according to the first embodiment and the LED module manufacturing method according to the third embodiment will be omitted. Hereinafter, processes for manufacturing the LED module will be sequentially described with reference to FIG. 13.

As shown in (a) of FIG. 13, the stamp 130 on which the LED chip 100 is attached may approach a substrate 10i. The stamp 130 may be lifted or lowered in the first direction Z. As shown in (a) of FIG. 13, the stamp 130 may be lowered along the first direction Z to approach the substrate 10i.

As shown in (b) of FIG. 13, if the stamp 130 on which the LED chip 100 is attached sufficiently approaches the substrate 10i, the electromagnet 140 may operate. At this time, the electromagnet 140 may interact with the LED chip 100 attached on the stamp 130. That is, a magnetic force generated by the electromagnet 140 may be applied to the LED chip 100 attached on the stamp 130. Accordingly, an attractive force toward the substrate 10i can be applied to the LED chip 100.

As shown in (c) of FIG. 13, after the LED chip 100 is separated from the stamp 130 and positioned on the substrate 10i, the electromagnet 140 may stop operating. That is, after the LED chip 100 is positioned on the substrate 10i, the electromagnet 140 may no longer generate a magnetic force. In addition, after the LED chip 100 is positioned on the substrate 10i, the stamp 130 may move to increase a distance between the stamp 130 and the substrate 10i. More specifically, the stamp 130 may be lifted in the first direction Z to move away from the substrate 10i. The operation of stopping operating the electromagnet and the operation of moving the stamp 130 may be performed simultaneously or sequentially.

Figure 14:
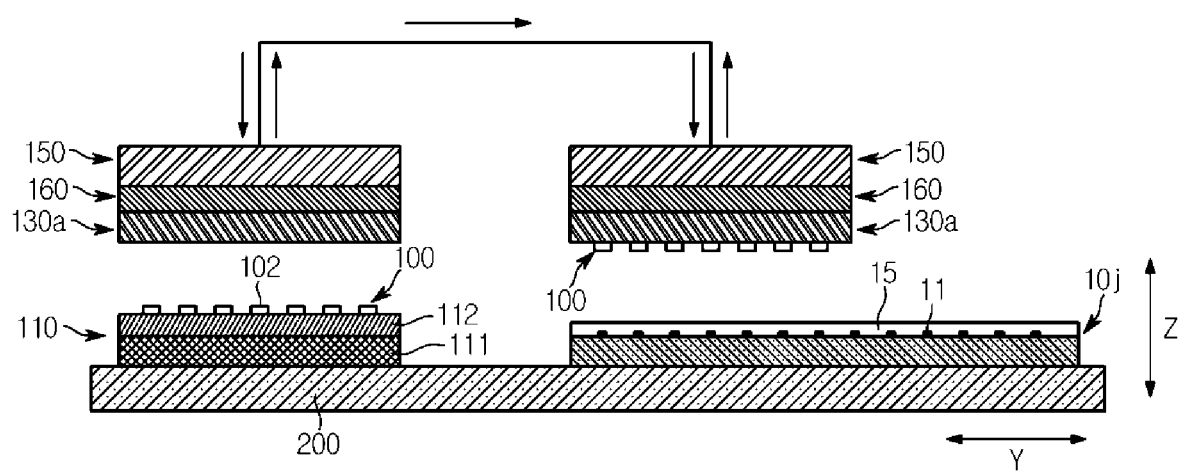
FIG. 14 is a view schematically showing a process of positioning an LED chip on a substrate in an LED module manufacturing method according to a fifth embodiment.

FIG. 14 is a view schematically showing a process of positioning an LED chip on a substrate in an LED module manufacturing method according to a fifth embodiment. Hereinafter, descriptions overlapping with those described in the LED module manufacturing method according to the first embodiment will be omitted.

As shown in FIG. 14, a LED module manufacturing apparatus may include the carrier 110. The LED chip 100 may be disposed on the carrier 110. More specifically, the carrier 110 may include a body 111, and an adhesive layer 112 formed on the body 111. The LED chip 100 may be disposed on the adhesive layer 112.

The LED module manufacturing apparatus may further include a substrate 10j. Preferably, the substrate 10j may be disposed adjacent to the carrier 110. The substrate 10j may include the electrode 11. The electrode 11 may include the positive (+) electrode and the negative (−) electrode. The substrate 10j may further include an adhesive layer 15. The adhesive layer 15 may be realized by solder. The adhesive layer 15 may electrically connect the electrode 102 of the LED chip 100 to the electrode 11 of the substrate 10j.

The LED module manufacturing apparatus may further include a stamp 130a. The stamp 130a may move to pick up the LED chip 100 from the carrier 110 and place the LED chip 100 on the substrate 10j. The stamp 130a may have an adhesive surface. The LED chip 100 picked up from the carrier 110 may be adhered on the adhesive surface of the stamp 130a. The LED chip 100 separated from the stamp 130a may be positioned on the substrate 10j. The stamp 130a may be formed of an elastic material.

The LED module manufacturing apparatus may further include a stamp driver 150 for moving the stamp 130a.

The LED module manufacturing apparatus may further include a stamp connector 160 positioned between the stamp 130a and the stamp driver 150. The stamp connector 160 may support the stamp 130a. In another aspect, the stamp connector 160 may connect the stamp 130a to the stamp driver 150. More specifically, the stamp connector 160 may apply a suction force to the stamp 130a to connect the stamp 130a to the stamp driver 150.

Hereinafter, processes for manufacturing the LED module will be sequentially described.

The carrier 110 on which the LED chip 100 is disposed may be prepared. The carrier 110 may be disposed on a rail 200.

Then, the stamp 130a may approach the carrier 110. The stamp 130a may be lifted or lowered in the first direction Z. The stamp 130a may be lowered in the first direction Z to approach the carrier 110.

The stamp 130a located close to the carrier 110 may pick up the LED chip 100 from the carrier 110, and then rise in the first direction Z.

Then, the stamp 130a may move toward the substrate 10j. At this time, the LED chip 100 may be attached on the stamp 130a and move together with the stamp 130a. More specifically, the stamp 130a may move toward the substrate 10j along the second direction Y. At this time, the first direction Z may be perpendicular to the second direction Y, although not limited thereto.

The stamp 130a may approach the substrate 10j so that the electrode 102 of the LED chip 100 picked up by the stamp 130a corresponds to the electrode 11 of the substrate 10j. The stamp 130a may be lowered toward the substrate 10j in the first direction Z. The substrate 10j may be disposed on the rail 200. The substrate 10j may be disposed on the same rail as the carrier 110 or on a rail that is different from the carrier 110.

After the LED chip 100 picked up by the stamp 130a is separated from the stamp 130a and positioned on the substrate 10j, the stamp 130a may be lifted in the first direction Z.

In the LED module manufacturing method according to the fifth embodiment, an adhesive force of the stamp 130a with respect to the LED chip 100 may need to be greater than an adhesive force of the carrier 110 with respect to the LED chip 100, and an adhesive force of the substrate 10j with respect to the LED chip 100 may need to be greater than the adhesive force of the stamp 130a with respect to the LED chip 100. In this case, the stamp 130a can pick up the LED chip 100 from the carrier 110, and the LED chip 100 picked up by the stamp 130a can be positioned on the substrate 10j.

In the LED module manufacturing method according to the first embodiment, the LED module manufacturing method according to the second embodiment, the LED module manufacturing method according to the third embodiment, and the LED module manufacturing method according to the fourth embodiment, the LED chip 100 picked up by the stamp 130 may be easily separated from the stamp 130 and effectively positioned on the substrates 10a, 10g, 10h and 10i, although an adhesive force of the substrates 10a, 10g, 10h and 10i with respect to the LED chip 100 is equal to or smaller than an adhesive force of the stamp 130 with respect to the LED chip 100. Therefore, if the LED module manufacturing methods according to the first to fourth embodiments are used, the LED chip 100 picked up by the stamp 130 may be efficiently positioned on the substrates 10a, 10g, 10h and 10i regardless of the adhesive force of the substrates 10a, 10g, 10h, and 10i with respect to the LED chip 100.

A plurality of LED chips can be accurately and densely positioned on a substrate by using the LED module manufacturing apparatus. Therefore, a display device having a high resolution can be realized.

When LED chips are picked up and transported using the LED module manufacturing apparatus, there is no need to apply static electricity to the LED chips, thereby effectively preventing the LED chips from being damaged.

By using a mask disposed on a substrate, LED chips can be easily separated from a stamp and positioned on the substrate although a binding force of the stamp with respect to the LED chips is greater than a binding force of the substrate with respect to the LED chips.

By using an electromagnet, LED chips can be easily separated from a stamp and positioned on a substrate although a binding force of the stamp with respect to the LED chips is greater than a binding force of the substrate to the LED chips.

The foregoing exemplary embodiments and advantages are merely exemplary and are not to be construed as limiting the disclosure. The description of exemplary embodiments is intended to be illustrative, and not to limit the scope of the claims, and many alternatives, modifications, and variations will be apparent to those skilled in the art. Although a few exemplary embodiments have been shown and described, it would be appreciated by those skilled in the art that changes may be made in these exemplary embodiments without departing from the principles and spirit of the disclosure, the scope of which is defined in the following claims and their equivalents.

What is claimed is:

1. A method of manufacturing an Light Emitting Diode (LED) module, comprising:
   preparing a substrate and a carrier with an LED chip thereon;
   having a mask on the prepared substrate;
   taking the LED chip from the carrier with a stamp;
   moving the taken LED chip to face an opening of the mask;
   moving the LED chip so that at least a part of the LED chip is inserted into the opening;
   positioning the LED chip on the substrate by moving the LED chip so that the at least a part of the LED chip contacts a wall of the mask; and
   separating the mask from the substrate.

2. The method according to claim 1, further comprising:
   moving the LED chip in a first direction so that the at least a part of the LED chip is inserted into the opening; and
   moving the LED chip in a second direction so that the at least a part of the LED chip contacts the wall, which forms the opening.

3. The method according to claim 2, wherein the opening and the wall are alternately disposed in the second direction.

4. The method according to claim 3, wherein the opening comprises:
   a shorter side extending in the second direction, and
   a longer side extending in a third direction.

5. The method according to claim 2, wherein a width of the opening is 120% of a width of the LED chip measured in the second direction.

6. The method according to claim 1, wherein the opening comprises a plurality of openings arranged in a grid pattern.

7. The method according to claim 1, wherein the opening comprises a curved portion.

8. The method according to claim 1, further comprising applying a magnetic force to position the LED chip on the substrate.

9. The method according to claim 8, wherein the LED chip comprises a material responding to the magnetic force.

10. The method according to claim 1, further comprising:
    moving the taken LED chip toward the substrate in a state in which the LED chip is attached to the stamp; and
    linearly moving or turning the stamp after at least a part of the LED chip is inserted into the opening.

* * * * *